United States Patent
Floyd et al.

(10) Patent No.: US 7,756,168 B2
(45) Date of Patent: Jul. 13, 2010

(54) METHOD FOR IMPROVING HIGH FREQUENCY OPERATION OF A VERTICAL CAVITY SURFACE EMITTING LASER (VCSEL) WITH MONOLITHICALLY INTEGRATED BRIDGE ARM

(75) Inventors: Phil Floyd, Sunnyvale, CA (US); Peter Kner, Oakland, CA (US); Decai Sun, Los Altos, CA (US)

(73) Assignee: NeoPhotonics Corporation, San Jose, CA (US)

( * ) Notice: Subject to any disclaimer, the term of this patent is extended or adjusted under 35 U.S.C. 154(b) by 570 days.

(21) Appl. No.: 10/900,015

(22) Filed: Jul. 26, 2004

(65) Prior Publication Data

US 2008/0259971 A1  Oct. 23, 2008

Related U.S. Application Data

(60) Provisional application No. 60/490,188, filed on Jul. 25, 2003.

(51) Int. Cl.
*H01S 3/10* (2006.01)
(52) U.S. Cl. ............... 372/20; 372/50.1; 372/50.124
(58) Field of Classification Search ............... 372/20, 372/50.1
See application file for complete search history.

(56) References Cited

U.S. PATENT DOCUMENTS

| 5,249,245 A * | 9/1993 | Lebby et al. ............ 385/89 |
| 6,465,811 B1 * | 10/2002 | Peters et al. ............ 257/99 |
| 6,808,319 B2 * | 10/2004 | Cheng et al. ............ 385/89 |

* cited by examiner

*Primary Examiner*—Dung T Nguyen
(74) *Attorney, Agent, or Firm*—Turocy & Watson, LLP

(57) ABSTRACT

A vertical cavity laser apparatus is provided. In one embodiment, the apparatus includes an electrically responsive substrate; a support block positioned on the electrically responsive substrate; a bridge arm structure coupled to the support block, the structure having a base; a laser active area on the bridge arm structure, a tuning pad on the bridge arm structure, a laser bond pad on the bridge arm structure with traces connecting the laser bond pad to the laser active area and base. The traces are positioned and shaped to be symmetric to avoid problems due to the asymmetry of the injection current. Additionally, in this embodiment, the laser bond pad is kept at a height of the base in order to minimize device capacitance and the traces are also kept at the height of the base. Methods are also provided whereby impedance matching and high speed performance can be accomplished irregardless of the mechanical configuration of the bridge arm structure.

22 Claims, 4 Drawing Sheets

METHOD FOR IMPROVING HIGH FREQUENCY OPERATION OF A VERTICAL CAVITY SURFACE EMITTING LASER (VCSEL) WITH MONOLITHICALLY INTEGRATED BRIDGE ARM

The present application claims the benefit of priority from U.S. Provisional Application Ser. No. 60/490,188 filed Jul. 25, 2003, fully incorporated herein by reference for all purposes.

BACKGROUND OF THE INVENTION

1. Technical Field

The present invention relates generally to semiconductor lasers, and more particularly to improving the performance of a tunable Vertical Cavity Surface Emitting Laser (VCSEL). The invention describes an approach adopted to minimize the device capacitance and therefore improve the device high frequency performance and impedance matching.

2. Background Art

Optical communication systems are a substantial and fast growing constituent of communications networks. Such optical systems include, but are not limited to, telecommunication systems, cable television systems, and Local Area Networks (LANs). Optical systems are described in Gowar, Ed. Optical Communication Systems, (Prentice Hall, N.Y.) c. 1993, the disclosure of which is incorporated herein by reference. Currently, the majority of optical systems are configured to carry an optical channel of a single wavelength over one or more optical wave-guides. To convey the information form plural sources, time division multiplexing is frequently employed (TDM). In time division multiplexing, a particular time slot is assigned to each information source, the complete signal being constructed from the signal collected from each time slot. While this is a useful technique for carrying plural information sources on a single channel, its capacity is limited by fiber dispersion and the need to generate high peak power pulses.

While the need for communication systems increases, the current capacity of existing wave-guiding media is limited. Although capacity may be expanded, e.g. by laying more fiber optic cables, the cost of such expansion is prohibitive. Consequently, there exists a need for a cost-effective way to increase the capacity of the existing optical wave-guides.

Wavelength division multiplexing (WDM) and dense wavelength division multiplexing (DWDM) have been explored as approaches for increasing the capacity of the existing fiber optic networks. Such system employs plural optical signal channels, each channel being assigned a particular channel wavelength. In a typical system, optical signal channels are generated, multiplexed to form an optical signal comprised of the individual optical signal channels, transmitted over a single wave-guide, and de-multiplexed such that each channel wavelength is individually routed to a designated receiver. Through the use of optical amplifiers, such as doped fiber amplifiers, plural optical channels are directly amplified simultaneously, facilitating the use of WDM and DWDM approaches in long distance optical systems.

Crucial to providing sufficient bandwidth for WDM and DWDM, while at the same time avoiding bottlenecks, is the ability to assign and re-assign wavelengths as needed throughout the network and providing the bandwidth when and where needed. Allowing more flexibility in the way fiber capacity is provisioned is the driving force behind the requirements of next generation optical networks. Future network capacity needs will probably require a multi fold scalability beyond a network's initial installed capacity and also a rapid service activation to allow high capacity links to be deployed as needed.

Such requirements are best met by tunable lasers that can be tuned over a wide range of wavelengths and switched at nanosecond speeds. A number of schemes have been proposed and studied to obtain frequency tuning of semiconductor lasers. These methods have typically relied on tuning the index of refraction of the optical cavity. The resulting tunable range is, however, restricted to approximately 10 nm.

In addition, the bulk of the tuning schemes have been attempted with edge emitting laser structures. Unlike vertical cavity surface emitting lasers (VCSEL), these structures are not single mode and consequently the use of distributed Bragg reflectors or distributed feedback, both of which are difficult to fabricate, are required to select a single mode.

Interferometric techniques that rely on variable selection of different Fabry-Perot modes for tuning from a comb of modes have also been proposed. Among these are asymmetric y-branch couplers and vertical cavity filters. These methods produce tuning ranges of up to 100 nm, but are, however, restricted to discrete tuning only and are potentially unstable between the tuning steps.

Most of the above mentioned techniques are polarization sensitive and therefore cannot be readily adopted to optical communications systems, which need to be robust and inexpensive and consequently insensitive to beam polarization.

A critical and costly problem in all WDM and DWDM is created by the need for exact wavelength registration between transmitters and receivers. A tunable receiver capable of locking to the incoming signal over a range of wavelengths variation would relax the extremely stringent wavelength registration problem. The tunability requirement can best be met by proper VCSEL utilization. VCSELs possess desirable qualities for telecommunications: circular mode profile, single mode operation, surface mode operation and compact size. Complete description of the VCSEL device and its operation can be found in the issued U.S. Pat. Nos. 5,629,951 and 5,771,253 both of which are incorporated herein by reference.

The existing VCSEL technology cantilever apparatus is shown in FIG. 1. The cantilever apparatus has a cantilever structure consisting of a base, an arm and an active head. The arm deflects towards the substrate as a function of the voltage applied.

The arm, however, has built in stresses due to the materials it is constructed of and is supported at the base only and. This one point support combined with the built in stresses of the device through continual use causes the arm to droop and change its vertical position relative to the substrate. In more extreme cases the arm will adhere to the substrate. The change in the vertical position will in turn change the length of the Fabry-Perot cavity and consequently the resonant wavelength of the device. The change in the device resonant wavelength will in the end disrupt the communications system employing the device and causing it to drop the affected channel and search for another. The disruption will be enhanced in the systems using multiple VCSEL's as the droop and the subsequent resonant wavelength shift will vary from device to device. Additionally, the cantilever arm of the present device has a tendency to tilt. The tilt in turn causes loss in the device intensity. It may be possible to reduce the droop or the tilt by making the cantilever arm shorter. This approach would, however, require higher tuning voltages in order to obtain the same device performance. Additional approaches include better stress control in the cantilever arm or implementing a stop on the cantilever arm that would limit the droop and prevent the arm from contacting the substrate. Additionally, in the course of device manufacturing, upon completion of an etch process, the cantilever arm in the existing structure tends to adhere to the substrate and can only be separated by an additional drying process step. The additional process step increases the device cost and in some cases does not successfully free the arm form the substrate.

VCSEL of this invention is a bridge arm apparatus based on the principle of an electrostatic force pulling on a simple bridge arm as shown in FIG. 2. The device so formed is capable of continuously tuning the resonant frequency of the Fabry-Perot cavity over a wide range of wavelengths. The resonant cavity is formed between two distributed Bragg reflector (DBR) mirrors. The top reflector is composed of a movable top DBR supported in a bridge arm, a variable thickness air spacer layer and a fixed DBR. The bottom reflector is fixed in the substrate. By applying a tuning voltage to create electrostatic attraction, the bridge arm may be deformed towards the substrate, thereby changing the thickness of the air spacer layer and consequently the resonant wavelength of the Fabry-Perot cavity. A precise control of substrate to bridge arm distance is necessary in order to maintain the desired wavelength and meet the wavelength stability requirements.

Unfortunately, the bridge VCSEL structure is inherently large and has high parasitic capacitance. This in turn adversely affects high frequency operation of a VCSEL. A performance of a typical VCSEL as a function of frequency is shown in FIG. 5. FIG. 6 shows effects of increased capacitance on VCEL performance. It is clear from FIG. 6 that high capacitance adversely effects the high frequency performance of a VSCEL and consequently its data transmission rates. In this case the high capacitance is due primarily to the p contact bonding pad of the laser and the associated long leads as shown in FIGS. 3 and 3A.

For the reasons there is a need for a device structure that reduces capacitance to the levels necessary to achieve the appropriate high frequency, performance. The invention disclosed herein meets such need.

SUMMARY OF THE INVENTION

It is an object of the present invention to provide a vertical cavity apparatus with stable bridge arm structure.

Another object of the present invention is to provide a vertical cavity apparatus without any bridge droop.

Yet another object of the present invention is to provide a vertical cavity apparatus without any tilt of the tuning arm.

A further object of the present invention is to provide a vertical cavity apparatus without any bridge arm droop induced wavelength shift.

Yet another object of the present invention is to provide a vertical cavity apparatus where the bridge arm will not adhere to the substrate.

A further object of the present invention is to simplify the manufacturing process for vertical cavity apparatus with a bridge arm Still another object of the present invention is to provide a vertical bridge structure vertical cavity apparatus that reduces the device capacitance and enables high frequency operation.

Yet another object of the present invention is to provide an impedance matching method of the laser traces to that of the laser itself or an appropriate input impedance.

Another objective of the present invention is to provide a method whereby impedance matching and high speed performance can be accomplished irregardless of the mechanical configuration of the device.

In one embodiment of the present invention, a vertical cavity laser apparatus is provided. The apparatus includes an electrically responsive substrate; a support block positioned on the electrically responsive substrate; a bridge arm structure coupled to the support block, the structure having a base; a laser active area on the bridge arm structure, a tuning pad on the bridge arm structure, a laser bond pad on the bridge arm structure with traces connecting the laser bond pad to the laser active area and base. The traces are positioned and shaped to be symmetric to avoid problems due to the asymmetry of the injection current. Additionally, in this embodiment, the laser bond pad is kept at a height of the base in order to minimize device capacitance and the traces are also kept at the height of the base.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a resistor" may include multiple resistors, and the like. References cited herein are hereby incorporated by reference in their entirety, except to the extent that they conflict with teachings explicitly set forth in this specification.

Figure 1:
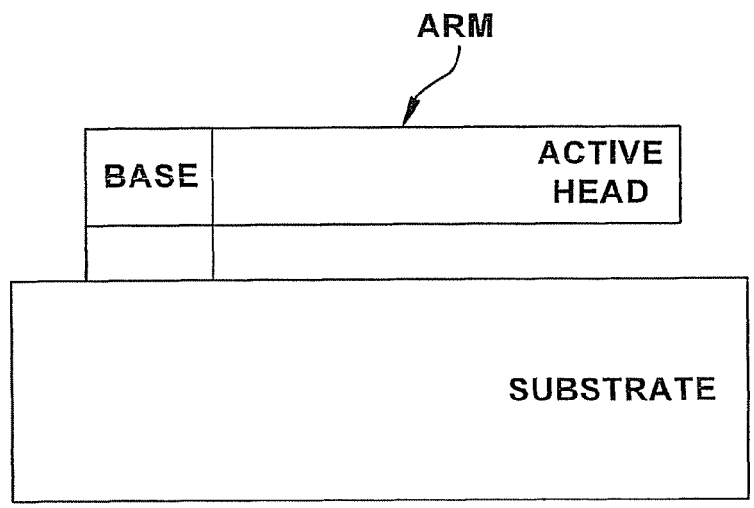
FIG. 1 is the side view of the existing vertical cavity cantilever apparatus.
Figure 2:
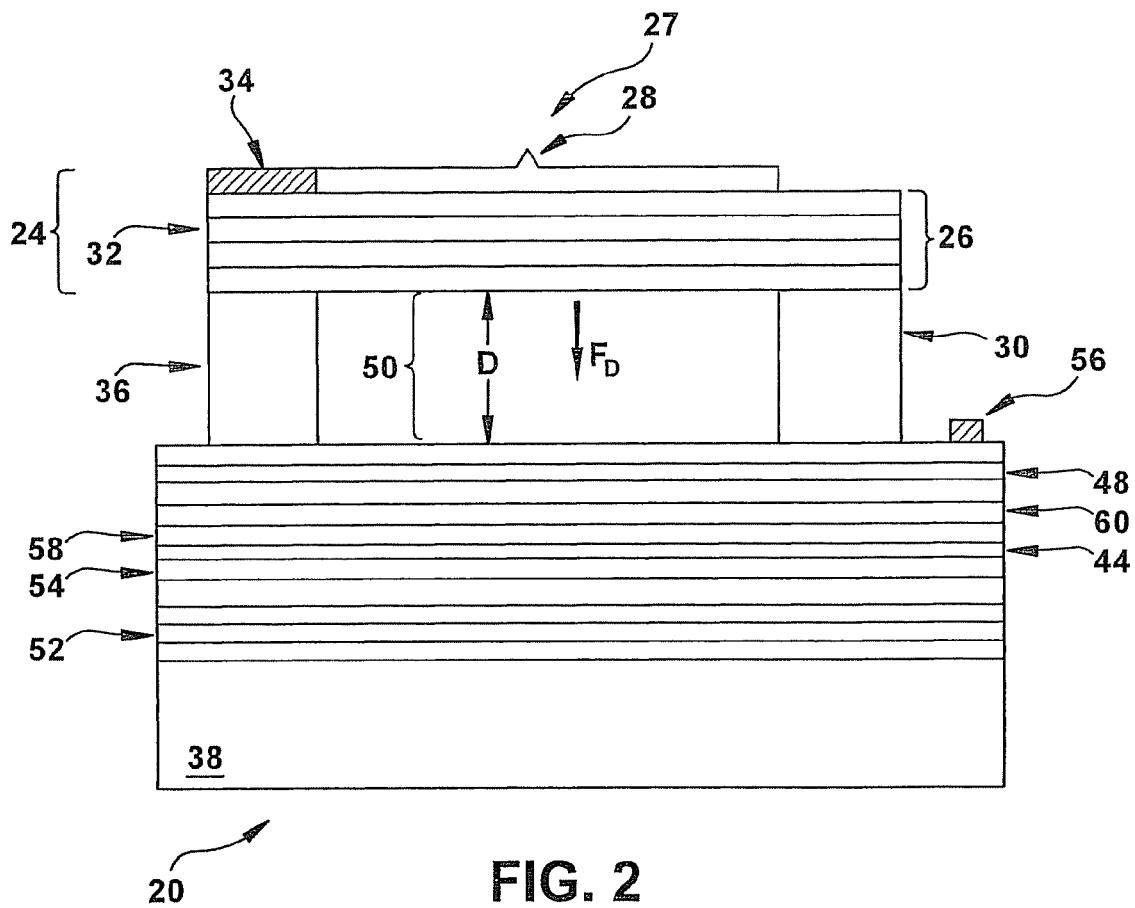
FIG. 2 is the side view of the bridge arm structure
Figure 3:
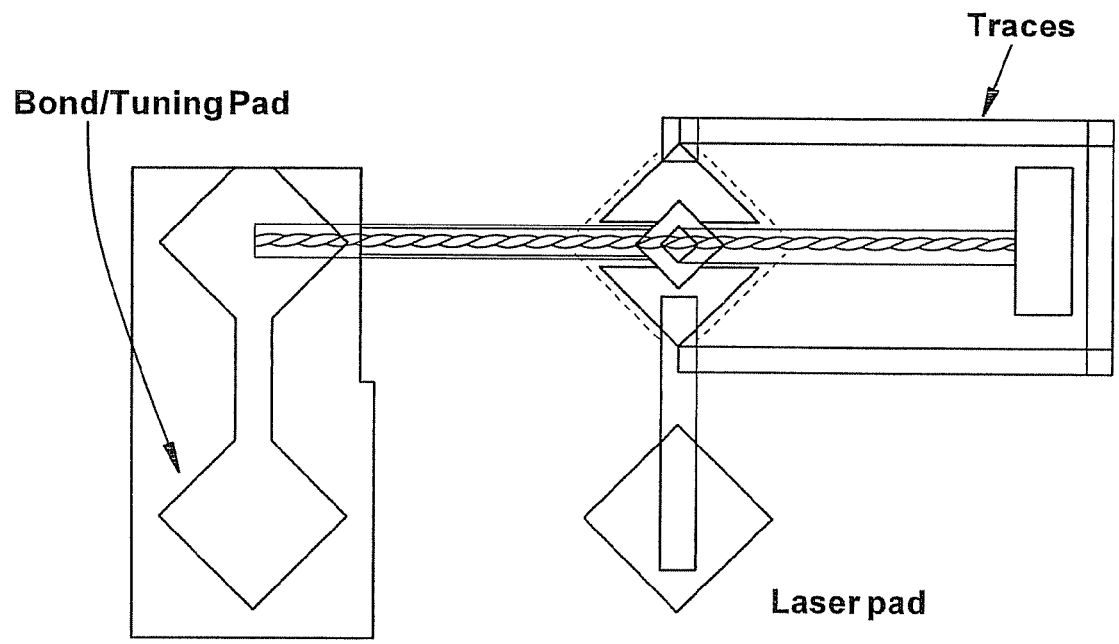
FIG. 3 is the top view of the existing bridge arm structure
Figure 3A:
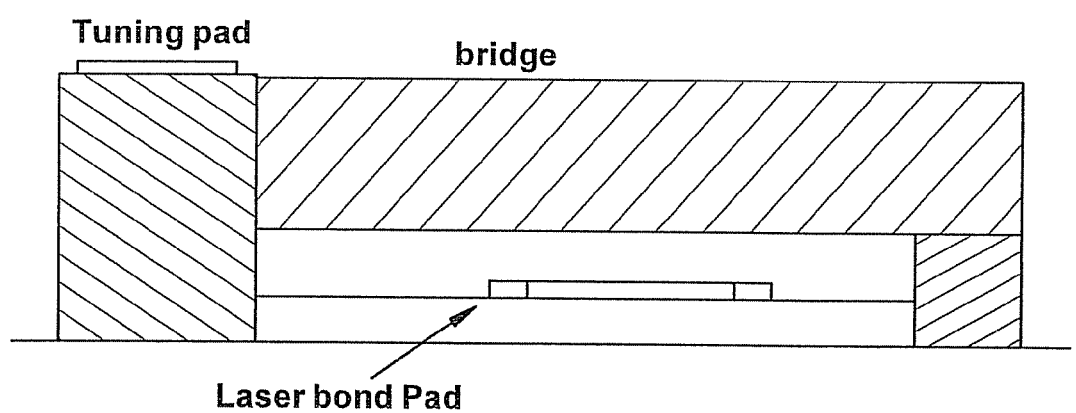
FIG. 3A is a side view of the existing bridge arm structure

In the most basic embodiment, a bridge arm apparatus according to the invention makes use of an electrostatic force pulling on a simple bridge arm. The mechanical deflection resulting from this force can be used to change the length of the Fabry-Perot microcavity and consequently to tune the resonant wavelength. FIG. 2 shows a side view of simple embodiment of such an apparatus. If desired the device can be designed to operate at fixed wavelength.

In particular, a bridge arm apparatus 20 has a bridge arm structure 22 consisting of a base 24, a bridge arm 26, active head 28, and anchor 30. In the embodiment shown, the bulk of the bridge arm structure 22 consists of four reflective layers 32, which form a distributed Bragg reflector (DBR). It is preferable to make layers 32 of AlGaAs. Different compositional ratios are used for individual layers 32, e.g., Al(0.09) Ga(0.91)As/Al(0.58) Ga(0.42)As. The topmost layer 32 is heavily doped to ensure good contact with an electrical tuning contact 34 deposited on top of bridge arm structure 22. The actual number of layers 32 varies from 1-20 depending on the desired reflectivity of DBR 32. Furthermore, any suitable reflective material other than AlGaAs may be used to produce the reflective layers 32. A person skilled in the art will be able to choose the right materials and dimensional parameters for the reflective layers 32. Finally, it is not even necessary that the bridge arm 26 or the base 24 be made of reflective layers as long as the active head 28 includes the reflective layers 30.

In the embodiment shown, base 24 and anchor 30 are rectangular and suitably large to ensure dimensional stability of the structure 22. The width of the bridge arm 26 ranges typically from 5 to 10 microns while the length is 100 to 500 microns or more. The bridge arm stiffness increases as the length decreases. Consequently, a shorter bridge arm requires greater forces to deform but the shorter bridge arm also resonates at a higher frequency. The preferred diameter of the active head 28 falls between 10 and 40 microns. Of course, the other dimensions are also possible and a person skilled in the art will be able to compute them according to the requirements at hand.

Electrical tuning contact 34 residues on top of bridge arm structure 22. In this embodiment, electrical tuning contact 34 is made of gold. However, any other electrically conducting material can be used and it is not necessary that the entire top surface of bridge arm structure 22 be covered. The only limitation is that the tuning contact 34 be sufficiently large to allow application of the first tuning voltage V(t1) as discussed below.

Base 24 rests on a support block 36 across which a voltage can be sustained. In this case, block 36 is composed of GaAs or InP. Block 36 sits on an electrically responsive substrate 38, preferably made of suitably doped GaAs or InP. A forward voltage is applied to the substrate 38 via the contact 56. A voltage difference between layers 32 and substrate 38 causes a deflection of arm 26 towards substrate 38. If layers 32 and substrate 38 are opposite doped, then a reverse bias voltage can be established between them. Substrate 38 is sufficiently thick to provide mechanical stability to entire bridge arm apparatus 20. Inside substrate 38 and directly under active head 28 are lodged one or more sets of reflective layers 32 forming a second DBR.

A Fabry-Perot cavity 40 is formed by a top reflector 42, an active region or medium 54, a conventional cavity spacer layer 44, and a bottom reflector 46. Top reflector 42 is formed by DBR layers 30, an air gap 50, which acts as a DBR layer, and a second set of reflective layers 48 in the substrate 38. In other words, top reflector 42 is composed of two semiconductor portions sandwiching tunable air gap 50. The first semiconductor portion is contained in active head 28 in the layers 32. The second semiconductor portion, consisting of layers 48, is lodged inside substrate 38.

Bottom reflector 46 is composed of four reflecting layers 52. Just as in the case of layers 32, the number of layers 52 will depend on the desired reflectivity of bottom reflector 46. If, as in a filter, no active region or spacer layer is required, the top reflector may be composed of only top DBR layers 32. In this case, air gap 50 may itself form the spacer layer, and the bottom reflector is formed by layers 52.

In a Fabry-Perot cavity such as cavity 40, the total number of layers similar to layers 48 can vary from none to several tens. If no active layer is needed, tunable air gap 50 can itself form the spacer layer and the top reflector can be entirely formed from layers 32 lodged in active head 28. However, where an active layer is required, such as in laser or in detector, tunable air gap 50 and the cavity spacer layer such as layer 44 may be distinct and independent. In this case, at least one layer 48 is required. The actual number of layers 48 depends on the number of layers 32, the desired reflectivity, the desired tuning range, and other well-known optical parameters of the apparatus. However, in any bridge arm apparatus similar to apparatus 20, active head 28 has to contain at least one layer 32. The size of the active head 28 can be tailored to suit the specific device requirements. Additionally, a current confinement layer 60 may be employed in laser applications. The layer 60 is comprised of group III-V material and another readily oxidizable element, preferably aluminum, or the layer 60 may be formed by proper ion implantation techniques. If needed, the heat spreading layer 58 is utilized to reduce the heat accumulation in the device. The layer 58 is comprised of the group III-V materials, such as GaAs, InP, or similar.

The remaining part of Fabry-Perot cavity 40 consists of a conventional cavity spacer 44, active medium 54 and four reflecting layers 52. The latter constitute bottom reflector 46. Just as in the case of layers 32 and 48, the number of layers 52 will vary depending on the desired reflectivity of bottom reflector 46.

As indicated in FIG. 2, the height of block 36 is approximately 2.5 microns; thus the bridge arm structure 22 is situated approximately at distance D=1.2 microns above substrate 38. Of course, block 36 can be placed significantly higher or lower, depending on the desired tuning range.

The operation of the bridge arm apparatus 20 is best visualized by referring to FIG. 2. To tune the Fabry-Perot cavity 40 a first tuning voltage Vt1 is applied to a tuning contact 34. The application of Vt1 results in charge accumulation on contact 34 and the bridge structure 22. The charge on contact 34 and structure 22 causes an equal and opposite charge to amass at the surface of electrically responsive substrate 38. The attracting charges produce a vertical force Fd acting on the bridge arm 26 and the active head 28. Vertical force Fd causes the bridge arm 26 to deform and distance D to decrease.

As distance D decreases so does the effective length of Fabry-Perot 40. A change in the cavity length alters the resonance wavelength of the cavity. Thus, decreasing distance D results in decease in the resonance wavelength of the Fabry-Perot micro cavity. Furthermore since distance D is a continuous function of tuning voltage Vt1, and since Vt1 can be adjusted continuously, the tuning of the wavelength is continuous. Because active head 28 is nearly circularly symmetric, the bridge arm apparatus 20 is polarization-insensitive and thus well suited for applications in optical communications systems.

Figure 4:
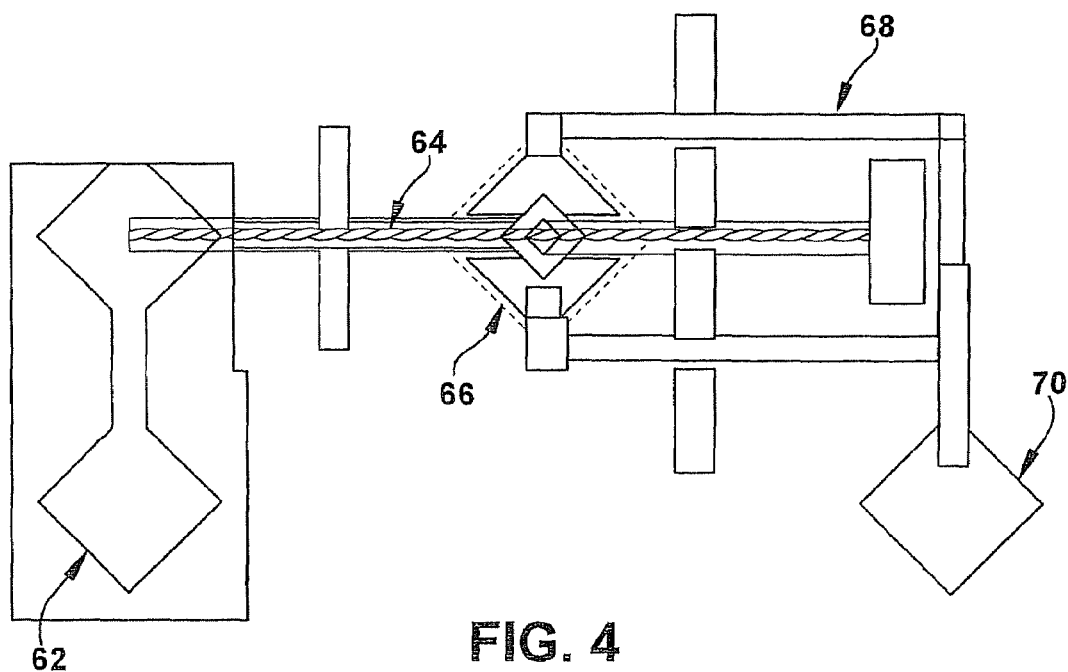
FIG. 4 is the top view of an improved embodiment of the bridge arm structure invention
Figure 4A:
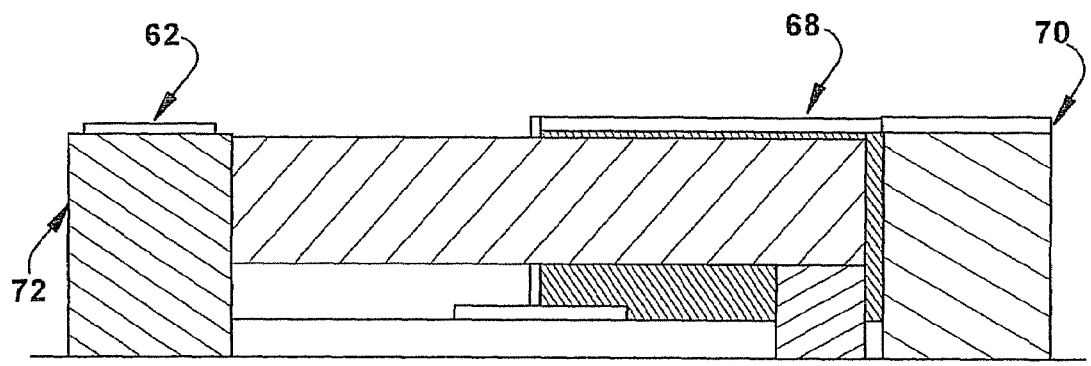
FIG. 4A is the side view of the improved embodiment of the bridge arm structure of this invention
Figure 5:
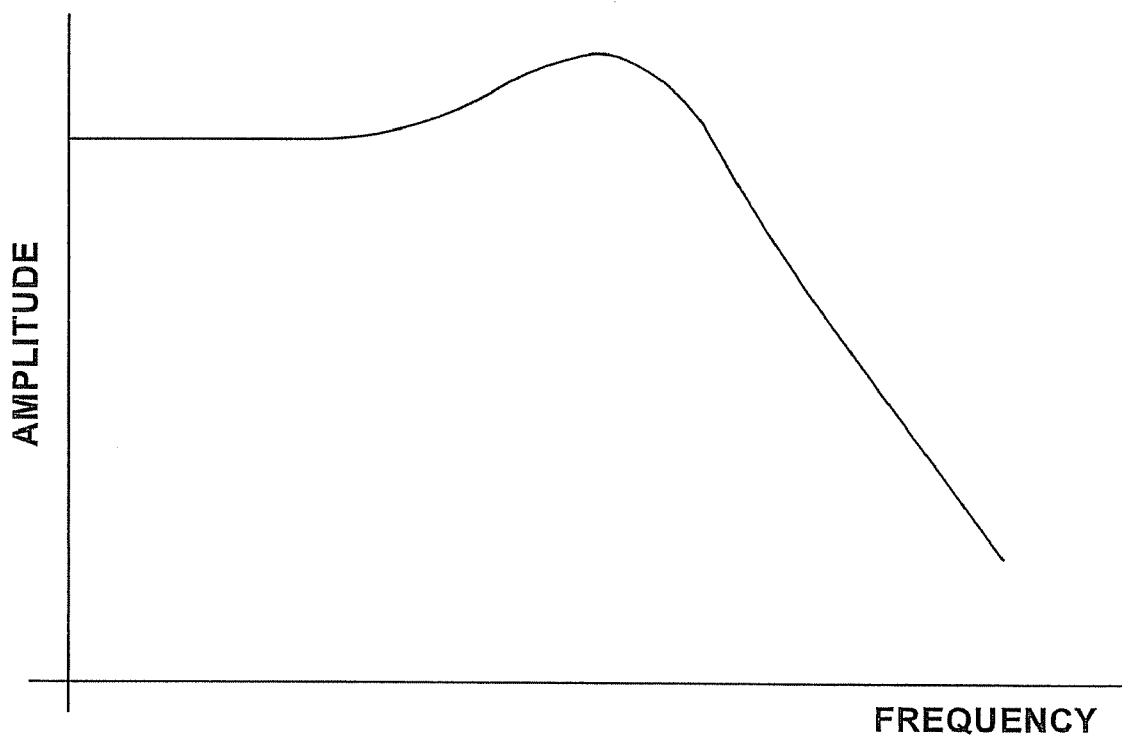
FIG. 5 shows typical VCSEL performance as function of frequency
Figure 6:
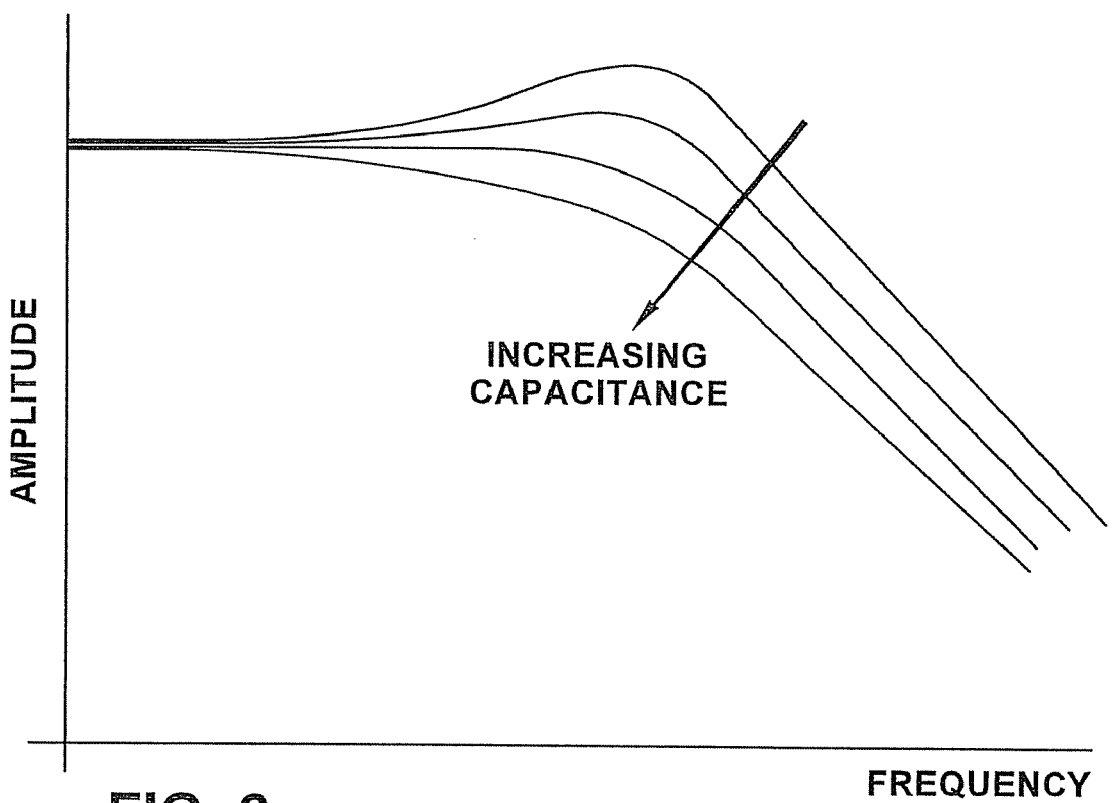
FIG. 6 shows the effect of increased capacitance on VCSEL performance.

Referring now to FIGS. 4 and 4A, on embodiment of a vertical cavity device according to the present invention will now be described. The bridge arm apparatus of this invention has a laser active area 66, the tuning pad 62, the bridge structure 64, the laser bond pad 70 and the traces 68 connecting the pad 70 to the area 66 and the base 72. The traces are symmetric to avoid any problems due to the asymmetry of the injection current. The laser bond pad 70 is kept at the height of the base 72 in order to minimize the device capacitance. For the same reason the traces 68 are also kept at the height of base 72. In way of an example, given the base 62 height of about 11 micrometers, the laser pad capacitance of 0.12 picofarads, the trace 68 capacitance of 0.14 picofarads and the laser active area capacitance of 1.4 picofarads gives the total capacitance of 1.66 picofarads. This value assures laser sufficient performance at a frequency of 2.5 gigabits/second. One skilled in the art will be able to calculate the dimensions of the traces and pads to achieve the capacitance desired and the necessary high frequency performance. Additionally, the impedance of the traces 68 can be matched to either a 50 Ohm input or the impedance of the laser itself.

Additional matching of the laser 20 bond pad 70 and associated bonding wire to 50 Ohms will further reduce impedance mismatch across the laser 20. This approach is insensitive to the length of traces 68 and therefore the bridge arm structure 64 can have different mechanical configurations and the laser 20 can still satisfy high speed performance requirements. One skilled in the art will be able to calculate appropriate trace dimensions by utilizing the following formula: Z(impedance)=[(Llength)/Clength]]exponent ½, wherein L=inductance and C=capacitance of the traces=(e)(A)/d; e=permitivity, A=trace area and d=separation.

Apparatus 20 is also simple in construction, easy to control and all the layers may be grown in one processing step.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, various methods of controlling capacitance may be combined.

The publications discussed or cited herein are provided solely for their disclosure prior to the filing date of the present application. Nothing herein is to be construed as an admission that embodiments of the present invention are not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited.

Expected variations or differences in the results are contemplated in accordance with the objects and practices of various embodiments of the present invention. It is intended, therefore, that the invention be defined by the scope of the claims which follow and that such claims be interpreted as broadly as is reasonable.

What is claimed is:

1. A vertical cavity laser apparatus comprising:
   an electrically responsive substrate;
   a support block positioned on said electrically responsive substrate;
   a bridge arm structure coupled to said support block, said structure having a base;
   a laser active area on the bridge arm structure,
   a tuning pad on the bridge arm structure,
   a laser bond pad on the bridge arm structure with traces connecting the laser bond pad to the laser active area and base, wherein the traces are positioned and shaped to be symmetric to avoid problems due to the asymmetry of the injection current;
   wherein the laser bond pad is kept at a height of the base in order to minimize device capacitance and the traces are also kept at the height of the base.

2. The device of claim 1 wherein the base has a height of about 11 micrometers and wherein the laser pad has a capacitance of 0.12 picofarads, the trace has a capacitance of 0.14 picofarads and the laser active area has a capacitance of 1.4 picofarads to give a total device capacitance of 1.66 picofarads.

3. The device of claim 1 wherein the impedance of the traces is matched to one of the following: a 50 Ohm input or impedance of the laser itself.

4. The device of claim 1 wherein the laser bond pad and associated bonding wire each have an impedance matched to 50 Ohms to reduce impedance mismatch across the laser.

5. The device of claim 1 wherein the impedance is insensitive to the length of traces and therefore the bridge arm structure can have different mechanical configurations.

6. The device of claim 1 wherein the trace have dimensions determined according to the following formula: Z(impedance)=[(Llength)/Clength]]exponent ½, wherein L=inductance and C=capacitance of the traces=(e)(A)/d; e=permitivity, A=trace area and d=separation.

7. The device of claim 1 without any bridge droop.

8. The device of claim 1 without any tilt of the tuning arm.

9. The device of claim 1 without any bridge arm droop induced wavelength shift.

10. The device of claim 1 where the bridge arm will not adhere to the substrate.

11. The device of claim 1 wherein the vertical cavity apparatus reduces the device capacitance and enables high frequency operation.

12. A method for forming a vertical cavity laser apparatus comprising:
    providing an electrically responsive substrate;
    providing a support block positioned on said electrically responsive substrate;
    providing a bridge arm structure coupled to said support block, said structure having a base;
    providing a laser active area on the bridge arm structure,
    providing a tuning pad on the bridge arm structure,
    providing a laser bond pad on the bridge arm structure with traces connecting the laser bond pad to the laser active area and base,
    positioning and shaping in the traces to be symmetric to avoid problems due to the asymmetry of the injection current;
    positioning the laser bond pad at a height of the base in order to minimize device capacitance and positioning the traces at the height of the base.

13. The method of claim 12 further comprising matching the impedance of the traces to one of the following: a 50 Ohm input or impedance of the laser itself.

14. The method of claim 12 further comprising reducing impedance mismatch across the laser by matching the laser bond pad and associated bonding wire to each have an impedance of 50 Ohms.

15. The method of claim 12 wherein the impedance is insensitive to the length of traces and therefore the bridge arm structure can have different mechanical configurations.

16. The method of claim 12 further comprising forming the trace to have dimensions determined according to the following formula: Z(impedance)=[(Llength)/Clength]]exponent ½, wherein L=inductance and C=capacitance of the traces= (e)(A)/d; e=permitivity, A=trace area and d=separation.

17. The method of claim 12 wherein the bridge arm structure is provided without any bridge droop.

18. The method of claim 12 wherein the bridge arm structure is provided without any tilt of the tuning arm.

19. The method of claim 12 without any bridge arm droop induced wavelength shift.

20. The method of claim 12 wherein the bridge arm will not adhere to the substrate.

21. The method of claim 12 further comprising reducing the device capacitance and enabling high frequency operation.

22. An impedance matching method of the laser traces to that of the laser itself or an appropriate input impedance, the method comprising:
    providing an electrically responsive substrate;
    providing a support block positioned on said electrically responsive substrate;

providing a bridge arm structure coupled to said support block, said structure having a base;
providing a laser active area on the bridge arm structure,
providing a tuning pad on the bridge arm structure,
providing a laser bond pad on the bridge arm structure with traces connecting the laser bond pad to the laser active area and base,
forming said traces to have dimensions determined according to the following formula: Z(impedance)=[(Llength)/Clength]]exponent ½, wherein L=inductance and C=capacitance of the traces=(e)(A)/d; e=permitivity, A=trace area and d=separation.

* * * * *